(12) United States Patent
Liu

(10) Patent No.: US 12,198,933 B2
(45) Date of Patent: Jan. 14, 2025

(54) FORMING METHOD OF SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 538 days.

(21) Appl. No.: 17/604,477

(22) PCT Filed: Jun. 30, 2021

(86) PCT No.: PCT/CN2021/103874
§ 371 (c)(1),
(2) Date: Oct. 18, 2021

(87) PCT Pub. No.: WO2022/095484
PCT Pub. Date: May 12, 2022

(65) Prior Publication Data
US 2023/0101884 A1     Mar. 30, 2023

(30) Foreign Application Priority Data
Nov. 6, 2020    (CN) .......................... 202011233498.8

(51) Int. Cl.
*H01L 21/033*  (2006.01)
*H01L 23/528*  (2006.01)
*H10B 12/00*  (2023.01)

(52) U.S. Cl.
CPC ...... *H01L 21/0337* (2013.01); *H01L 21/0334* (2013.01); *H01L 21/0338* (2013.01);
(Continued)

(58) Field of Classification Search
CPC ............. H01L 21/0338; H01L 21/0335; H01L 21/0337; H01L 21/0334; H01L 23/528; H10B 12/482; H10B 12/488
See application file for complete search history.

(56) References Cited

U.S. PATENT DOCUMENTS

2006/0056228 A1\*  3/2006  Schloesser ............ H01L 29/785
                                                          257/E21.654
2012/0020158 A1    1/2012  Ozaki et al.
(Continued)

FOREIGN PATENT DOCUMENTS

| CN | 102347334 A | 2/2012 |
| CN | 104425506 A | 3/2015 |
| CN | 105321872 A | 2/2016 |

OTHER PUBLICATIONS

International Search Report cited in PCT/CN2021/103874 mailed Aug. 30, 2021, 4 pages.

*Primary Examiner* — Ratisha Mehta
*Assistant Examiner* — Brad A Knudson
(74) *Attorney, Agent, or Firm* — Syncoda LLC; Feng Ma

(57) ABSTRACT

Embodiments of the present disclosure provide a forming method of a semiconductor structure and a semiconductor structure. The forming method includes: providing a base, the base includes a central region and dummy regions, and the central region includes a molding region and cutting regions; forming multiple spaced core pillars on the base; forming an initial mask layer surrounding and covering a sidewall of each core pillar on the base; removing the initial mask layers located in each cutting region to form multiple spaced mask sidewall strips in the molding region, and retaining at least one of the initial mask layers in each dummy region as a ring-shaped sidewall; removing the core pillars located in the central region and the dummy regions; and etching the base to form multiple functional structures,
(Continued)

and etching the base to form dummy functional structures on two sides of the multiple functional structures.

17 Claims, 8 Drawing Sheets

(52) U.S. Cl.
CPC ........ *H01L 21/0335* (2013.01); *H01L 23/528* (2013.01); *H10B 12/482* (2023.02); *H10B 12/488* (2023.02)

(56) References Cited

U.S. PATENT DOCUMENTS

| | | | |
|---|---|---|---|
| 2012/0032266 A1* | 2/2012 | Inoue | H10B 41/10 |
| | | | 257/365 |
| 2012/0118854 A1* | 5/2012 | Smayling | H01L 27/0207 |
| | | | 216/37 |
| 2012/0244696 A1* | 9/2012 | Nagashima | H01L 29/40114 |
| | | | 257/E21.209 |
| 2012/0289039 A1* | 11/2012 | Kajiwara | H01L 21/32139 |
| | | | 438/588 |
| 2015/0060975 A1 | 3/2015 | Nitta et al. | |
| 2017/0365675 A1* | 12/2017 | Chang | H01L 21/32139 |
| 2017/0373078 A1 | 12/2017 | Chu et al. | |
| 2020/0090929 A1* | 3/2020 | Tran | H01L 27/105 |

\* cited by examiner

FORMING METHOD OF SEMICONDUCTOR STRUCTURE AND SEMICONDUCTOR STRUCTURE

CROSS-REFERENCE TO RELATED APPLICATIONS

The present disclosure claims the priority to Chinese Patent Application No. 202011233498.8, titled "FORMING METHOD OF SEMICONDUCTOR STRUCTURE AND SEMICONDUCTOR STRUCTURE", filed with China National Intellectual Property Administration (CNIPA) on Nov. 6, 2020, which is incorporated herein by reference in its entirety.

TECHNICAL FIELD

The present disclosure relates to, but is not limited to, a forming method of a semiconductor structure and a semiconductor structure.

BACKGROUND

With the development of miniaturization of various electronic products, the design of memory cells must also meet the requirements of high integration and high density. However, when the functional structure of the memory cell is formed, due to the optical proximity effect, the pattern on the edge of the functional structure tends to be irregular.

Multiple spaced dummy functional structures are provided on one side of the functional structure to solve the problem of the optical proximity effect-induced irregular pattern on the edge of the functional structure. However, since the multiple spaced dummy functional structures are not connected with each other, a single dummy functional structure is not stable enough and is prone to deformation, which will adversely affect the semiconductor structure.

SUMMARY

A first aspect of the present disclosure provides a forming method of a semiconductor structure. The forming method includes: providing a base, where the base includes a central region and dummy regions located on two opposite outer sides of edges of the central region in a first direction, and the central region includes a molding region and cutting regions located on two opposite outer sides of edges of the molding region in a second direction; forming multiple spaced core pillars on the base, the core pillars located in the central region straddle the molding region and the cutting regions, and at least one of the core pillars is formed in each of the dummy regions; forming an initial mask layer surrounding and covering a sidewall of each of the core pillars on the base; removing the initial mask layers located in each of the cutting regions to form multiple spaced mask sidewall strips in the molding region, and retaining at least one of the initial mask layers in each of the dummy regions as a ring-shaped sidewall; removing the core pillars located in the central region and the dummy regions; and etching the base by using the mask sidewall strips as masks to form multiple functional structures, and etching the base by using the ring-shaped sidewalls as masks to form dummy functional structures on two sides of the multiple functional structures.

A second aspect of the present disclosure provides a semiconductor structure. The semiconductor structure includes: a base, the base includes a central region and dummy regions located on two opposite sides of the central region; multiple spaced functional structures, the functional structures are located on the base in the central region; and dummy functional structures, the dummy functional structures are located on the base in the dummy regions, and the dummy functional structures are ring-shaped structures.

BRIEF DESCRIPTION OF THE DRAWINGS

The drawings incorporated into the specification and constituting a part of the specification illustrate the embodiments of the present disclosure, and are used together with the description to explain the principles of the embodiments of the present disclosure. In these drawings, similar reference numerals are used to represent similar elements. The drawings in the following description are a part rather than all of the embodiments of the present disclosure. Those skilled in the art may derive other drawings based on these drawings without creative efforts.

One or more embodiments are exemplified by corresponding drawings, and these exemplified descriptions do not constitute a limitation on the embodiments. Components with the same reference numerals in the drawings are denoted as similar components, and the drawings are not limited by scale unless otherwise specified.

DETAILED DESCRIPTION

As mentioned in the background, the dummy functional structures of the prior art are not stable.

Figure 1:
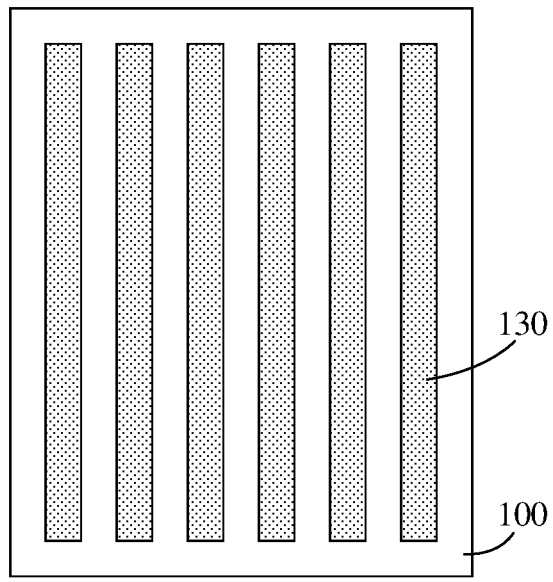
FIG. 1 is a view illustrating a structure obtained by implementing a step of forming core pillars on a base of a semiconductor structure.
Figure 2:
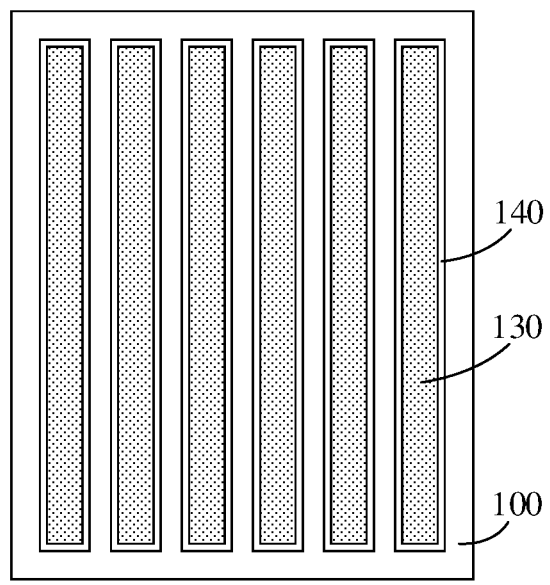
FIG. 2 is a view illustrating a structure obtained by implementing a step of forming initial mask layers on the base of a semiconductor structure.
Figure 3:
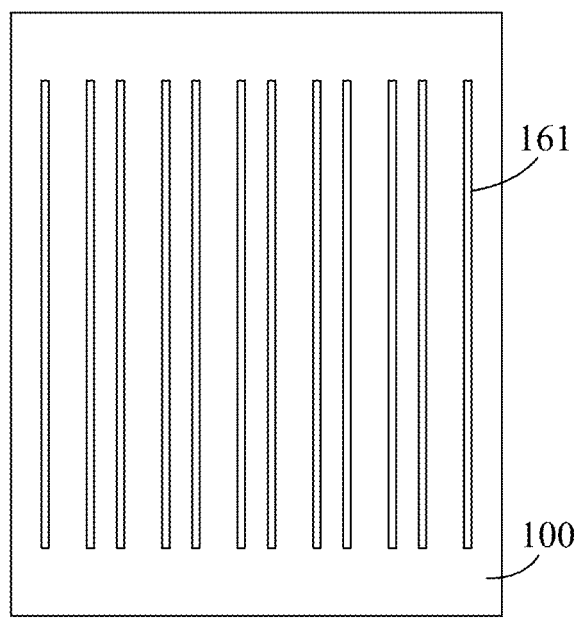
FIG. 3 is a view illustrating a structure obtained by implementing a step of forming functional structures of a semiconductor structure.

FIGS. 1 to 3 illustrate structures obtained by implementing various steps of a forming method of a semiconductor structure.

Referring to FIG. 1, core pillars 130 are formed on a base 100.

Referring to FIG. 2, an initial mask layer 140 surrounding and covering a sidewall of each of the core pillars 130 is formed on the base 100. The initial mask layer 140 is a ring-shaped structure surrounding the core pillar 130.

Referring to FIG. 3, the core pillars 130 and part of the initial mask layers 140 are removed to form spaced mask sidewall strips, and the mask sidewall strips are used as masks to etch to form spaced functional structures 161. The functional structures 161 may be bit lines.

In the semiconductor structure, the formed functional structures 161 and edges of the functional structures 161 are made of different materials. When the functional structures 161 are formed, due to the different materials, the optical proximity effect causes irregular patterns on the edges of the formed functional structures 161, resulting in undesirable structures on the edges of the formed functional structures.

In order to eliminate the adverse effect of the optical proximity effect on the functional structures, dummy functional structures that are made of the same material as the functional structures and spaced apart are formed on one side of each of the functional structures 161. However, the spaced dummy functional structures are unstable and prone to deformation, which will adversely affect the entire semiconductor structure.

A technical solution of a first aspect of the present disclosure provides a forming method of a semiconductor structure. The forming method forms ring-shaped dummy functional structures when forming functional structures, which eliminates the adverse effect of the optical proximity effect on the functional structures, and ensures the stability of the dummy functional structures.

The embodiments of the present disclosure are described in detail below with reference to the drawing. Those skilled in the art should understand that many technical details are proposed in the embodiments of the present disclosure to make the present disclosure better understood. However, even without these technical details and various changes and modifications made based on the following embodiments, the technical solutions claimed in the present disclosure may still be realized.

The forming method of a semiconductor structure provided by the embodiments of the present disclosure is described in detail below with reference to the drawings.

Figure 4:
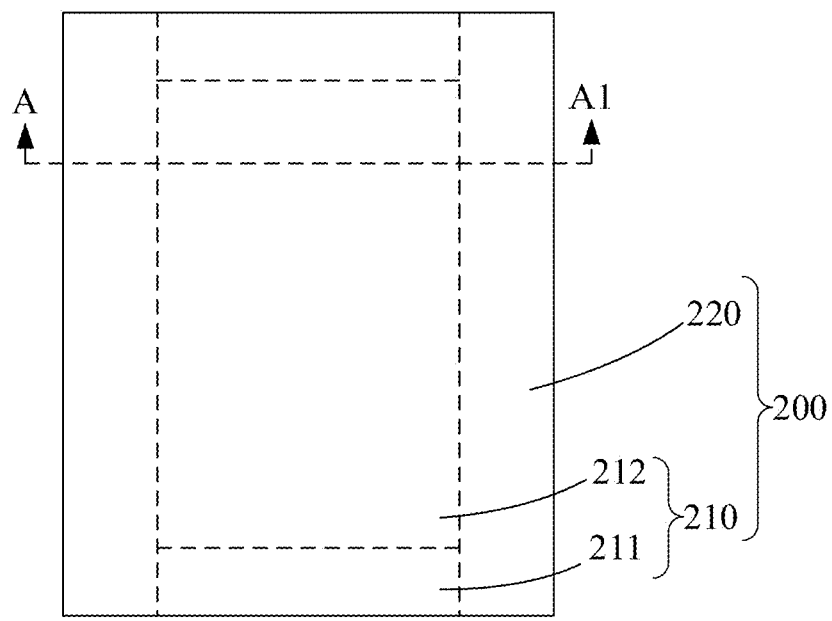
FIG. 4 is a bottom view of a base of a semiconductor structure according to a first embodiment of the present disclosure.
Figure 5:
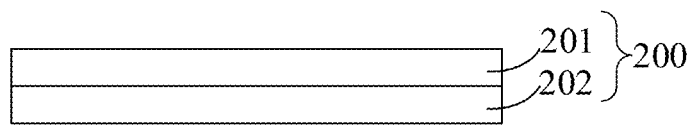
FIG. 5 is a front view of the base of the semiconductor structure according to the first embodiment of the present disclosure.

FIGS. 4 to 11 illustrate structures obtained by implementing various steps of a forming method of a semiconductor structure according to a first embodiment of the present disclosure. FIGS. 4 and 6 to 11 are top views of these structures, and FIG. 5 is a cross-sectional view taken along AA1 direction shown in FIG. 4.

Referring to FIGS. 4 and 5, a base 200 is provided. The base 200 includes a central region 210 and dummy regions 220 located on two opposite outer sides of edges of the central region 210 in a first direction. The central region 210 includes a molding region 212 and cutting regions 211 located on two opposite outer sides of edges of the molding region 212 in a second direction.

The central region 210 is a functional region of the semiconductor structure, and functional structures are formed in the central region 210 in a subsequent process. The dummy regions 220 are protective regions of the semiconductor structure, and dummy functional structures are formed in the dummy regions 220 in a subsequent process, which play a role of protecting the functional structures. The central region 210 is divided into a molding region 212 and cutting regions 211. In the subsequent process of forming the functional structures, the structures located in the cutting regions 211 are removed so as to form the functional structures that meet the requirements of the semiconductor structure.

In this embodiment, the base 200 includes a substrate 202 and an initial bit line layer 201.

The substrate 202 may be a silicon substrate, a germanium substrate, a silicon germanium substrate or a silicon on insulator (SOI) substrate, etc. The initial bit line layer 201 includes one or more conductive layers on the substrate 202. The initial bit line layer 201 is made of one or more of the groups consisting of polysilicon, tungsten, copper, aluminum, gold or silver. The initial bit line layer 201 may further include one or more insulating layers, which are, for example, made of one or more of the groups consisting of silicon nitride and silicon dioxide.

In other embodiments, the base may include a substrate and an initial word line layer. The substrate may include any one of an initial word line layer and an initial bit line layer.

Figure 6:
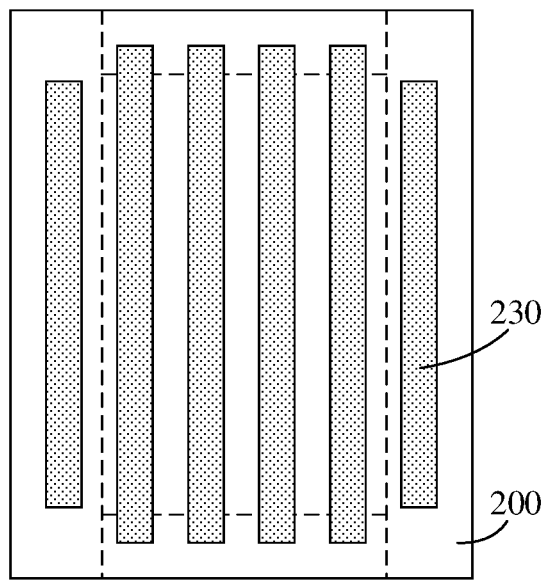
FIG. 6 is a view illustrating a structure obtained by implementing a step of forming core pillars on the base of the semiconductor structure according to the first embodiment of the present disclosure.

Referring to FIG. 6, multiple spaced core pillars 230 are formed on the base 200. Core pillars 230 located in the central region 210 (shown in FIG. 4) straddle the molding region 212 (shown in FIG. 4) and the cutting regions 211 (shown in FIG. 4), and at least one of the core pillars 230 is formed in each of the dummy regions 220 (shown in FIG. 4).

In this embodiment, the core pillars 230 in different regions are formed at the same time, and the core pillars 230 in different regions are made of the same material, which simplifies the process step.

The material of the core pillars 230 is different from that of the base 200, and may be amorphous silicon or amorphous carbon.

The core pillars 230 may be formed by using a double patterning process, which forms a core pillar film layer first and then forms the core pillars 230 by etching. Each of the core pillars 230 may be used as a core layer for subsequent formation of an initial mask layer.

The core pillars 230 located in the dummy regions 220 (shown in FIG. 4) are shorter than the core pillars 230 located in the central region 210 (shown in FIG. 4).

In addition to the configuration that the core pillars 230 located in the dummy regions 220 (shown in FIG. 4) are shorter than the core pillars 230 located in the central region 210 (shown in FIG. 4), ends of the core pillars 230 located in the dummy regions 220 do not exceed those of the core pillars 230 located in the central region 210. Therefore, an initial mask layer surrounding each of the core pillars 230 is formed. When part of the initial mask layer is removed, the shape of an orthographic projection of a pattern layer used as a mask on the base 200 is a rectangle. The shape of the pattern layer is simple and easy to form, which simplifies the process step.

Figure 7:
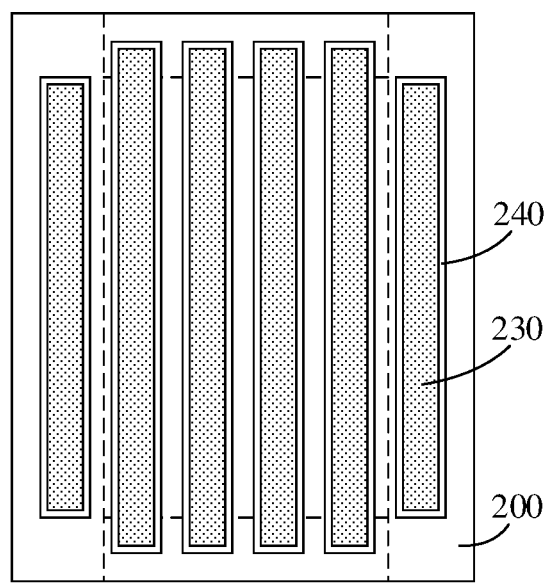
FIG. 7 is a view illustrating a structure obtained by implementing a step of forming initial mask layers on the base of the semiconductor structure according to the first embodiment of the present disclosure.

Referring to FIG. 7, an initial mask layer 240 surrounding and covering a sidewall of each of the core pillars 230 is formed on the base 200.

The initial mask layer 240 may be formed by using a self-aligned patterning method. Each core pillar 230 is taken as a core layer, and an initial mask layer is formed on the core layer. The initial mask on the top and periphery of the core pillar 230 is removed by using a maskless etching process, and only the initial mask surrounding a sidewall of the core pillar 230 is retained as the initial mask layer 240.

The initial mask layer 240 is made of a different material from the core pillar 230 and the base 200, and the material may be, but is not limited to, silicon nitride, silicon oxide or titanium oxide.

In this embodiment, the initial mask layer 240 surrounding the sidewall of the core pillar 230 in the dummy region 220 (shown in FIG. 4) is located at least in the dummy region 220. The thickness of the initial mask layer 240 located in the dummy region 220 in the first direction is equal to that of the initial mask layer 240 located in the central region 210.

In other embodiments, the thickness of the initial mask layer in the dummy region in the first direction is greater than that of the initial mask layer in the central region. A greater thickness of the initial mask layer in the dummy region leads to a greater thickness of the dummy functional structure formed by using the initial mask layer as a mask. A greater thickness of the dummy functional structure leads to a higher stability of the dummy functional structure.

Figure 8:
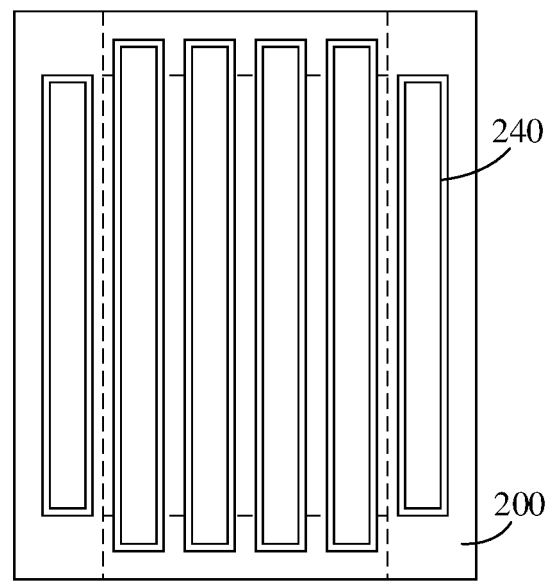
FIG. 8 is a view illustrating a structure obtained by implementing a step of removing the core pillars of the semiconductor structure according to the first embodiment of the present disclosure.

Referring to FIG. 8, in this embodiment, the core pillars 230 located in the dummy regions 220 (shown in FIG. 4) and the central region 210 (shown in FIG. 4) are removed first, and then the initial mask layers 240 located in the cutting regions 211 (shown in FIG. 4) are removed. In other embodiments, the initial mask layers located in the cutting regions are removed first, and then the core pillars are removed.

In this embodiment, the core pillars 230 may be removed by using a wet etching process. In other embodiments, the core pillars may also be removed by using a dry etching process.

Figure 9:
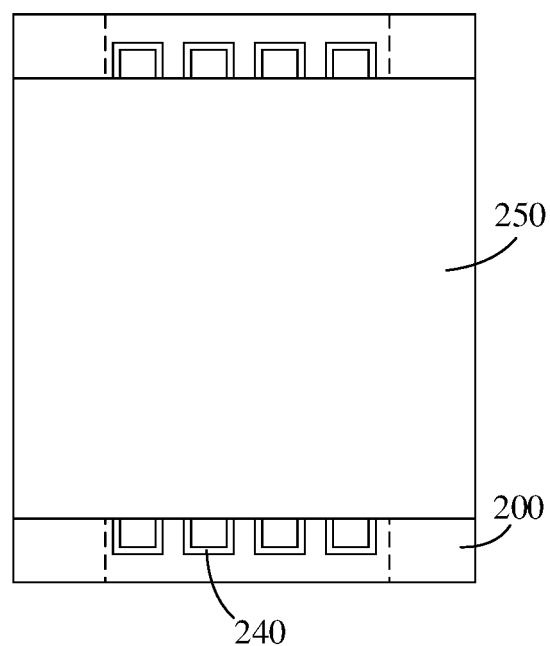
FIG. 9 is a view illustrating a structure obtained by implementing a step of forming a pattern layer of the semiconductor structure according to the first embodiment of the present disclosure.
Figure 10:
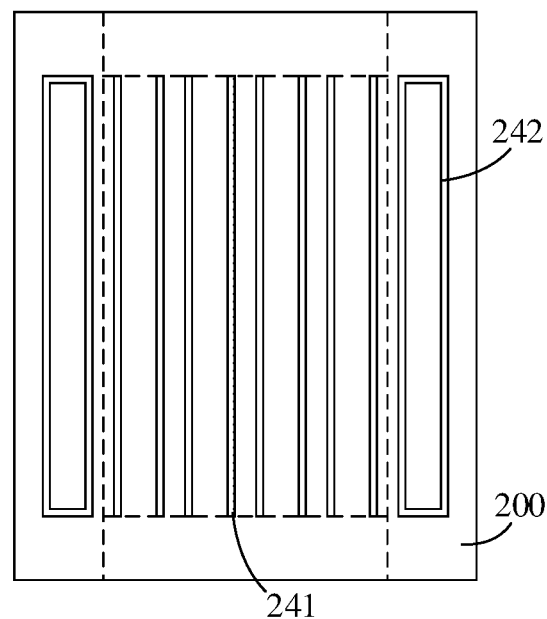
FIG. 10 is a view illustrating a structure obtained by implementing a step of forming mask sidewall strips and ring-shaped sidewalls of the semiconductor structure according to the first embodiment of the present disclosure.

Referring to FIGS. 9 and 10, the initial mask layers 240 located in the cutting regions 211 (shown in FIG. 4) are removed to form multiple spaced mask sidewall strips 241 in the molding region 212 (shown in FIG. 4), and the initial mask layers 240 in the dummy regions 220 (shown in FIG. 4) are retained as ring-shaped sidewalls 242.

The ring-shaped sidewalls 242 are formed in the dummy regions, and the base 200 is etched by using the ring-shaped sidewalls 242 as masks to form dummy functional structures. The formed dummy functional structures are ring-shaped structures, which are more stable than discrete structures.

Referring to FIG. 9, the initial mask layer 240 located in each of the cutting regions 211 (shown in FIG. 4) is removed by: forming a pattern layer 250, where the pattern layer 250 covers the initial mask layers 240 in the dummy regions 220 (shown in FIG. 4) and the molding region 212 (shown in FIG. 4), and exposes the initial mask layers 240 in the cutting regions 211 (shown in FIG. 4); and etch the initial mask layers 240 in the cutting regions 211 (shown in FIG. 4) away by using the pattern layer 250 as a mask.

In addition to the configuration that the core pillars 230 located in the dummy regions 220 (shown in FIG. 4) are shorter than the core pillars located in the central region 210 (shown in FIG. 4), ends of the core pillars 230 located in the dummy regions 220 do not exceed those of the core pillars 230 located in the central region 210. Therefore, when the pattern layer 250 is required to cover the core pillars 230 in the dummy regions 220 and the core pillars 230 in the molding region 212, the shape of the orthographic projection of the pattern layer 250 on the base 200 is a rectangle.

Figure 11:
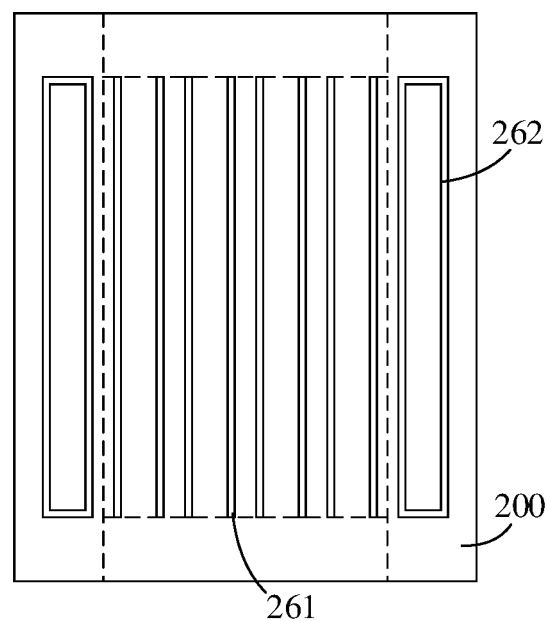
FIG. 11 is a view illustrating a structure obtained by implementing a step of forming functional structures and dummy functional structures of the semiconductor structure according to the first embodiment of the present disclosure.

Referring to FIGS. 10 and 11, the base 200 is etched by using the mask sidewall strips 241 as masks to form multiple functional structures 261, and the base 200 is etched by using the ring-shaped sidewalls 242 as masks to form dummy functional structures 262 on two sides of the multiple functional structures 261.

In this embodiment, the etching the base 200 by using the mask sidewall strips 241 as masks includes: etch the initial bit line layer 201 (shown in FIG. 5) to form the functional structures 261, the functional structures 261 being bit line structures. The etching the base 200 by using the ring-shaped sidewalls 242 as masks includes: etching the initial bit line layer 201 (shown in FIG. 5) to form the dummy functional structures 262, the dummy functional structures 262 being dummy bit line structures.

In other embodiments, the etching the base by using the mask sidewall strips as masks includes: etch the initial word line layer to form the functional structures, the functional structures being word line structures; the etching the base by using the ring-shaped sidewalls as masks includes: etch the initial word line layer to form the dummy functional structures, the dummy functional structures being dummy word line structures.

Since the functional structures 261 and the dummy functional structures 262 are formed by etching the same base 200, the functional structures 261 and the dummy functional structures 262 may be made of the same material, which may be tungsten or copper.

The dummy functional structures 262 and the functional structures 261 formed by etching are located on the substrate 202 (shown in FIG. 5).

In this embodiment, the dummy functional structures are formed on two sides of the functional structures, and the dummy functional structures are ring-shaped structures. The ring-shaped dummy functional structures ensure that the optical proximity effect-induced irregular patterns on the edges of the semiconductor structure are located on the dummy functional structures, so as to avoid affecting the functional structures. In addition, compared with discrete dummy functional structures, the ring-shaped dummy functional structures are more stable and less prone to deformation, thereby avoiding adversely affecting the semiconductor structure.

FIGS. 12 to 17 illustrate structures obtained by implementing various steps of a forming method of a semiconductor structure according to a second embodiment of the present disclosure.

The forming method of a semiconductor structure according to the second embodiment of the present disclosure is substantially the same as the forming method of a semiconductor structure according to the first embodiment. The main difference is that in the first embodiment, the length of the core pillars located in the dummy regions is less than that of the core pillars located in the central region, and in the second embodiment, the core pillars located in the dummy regions and the core pillars located in the central region have the same length, and have end surfaces flush with each other. The embodiments of the present disclosure are described in detail below with reference to the drawings.

Figure 12:
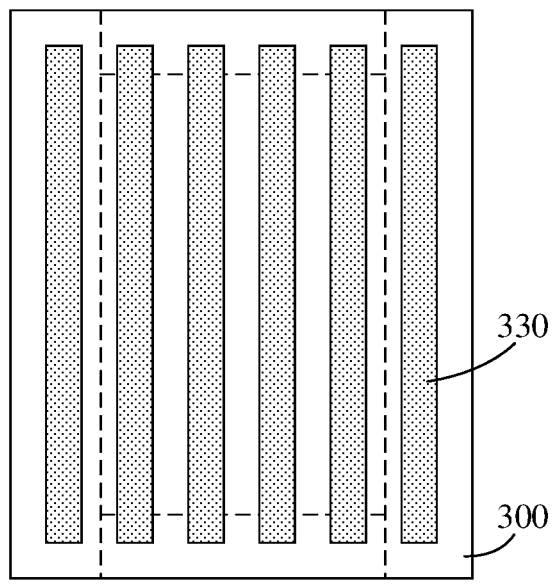
FIG. 12 is a view illustrating a structure obtained by implementing a step of forming core pillars on a base of a semiconductor structure according to a second embodiment of the present disclosure.

Referring to FIG. 12, multiple spaced core pillars 330 are formed on a base 300. Core pillars 330 located in the central region 210 (shown in FIG. 4) straddle the molding region 212 (shown in FIG. 4) and the cutting regions 211 (shown in FIG. 4), and at least one of the core pillars 330 is formed in each of the dummy regions 220 (shown in FIG. 4). The core pillars 330 located in the dummy regions 220 (shown in FIG. 4) and the core pillars 330 located in the central region 210 (shown in FIG. 4) have the same length, and have end surfaces flush with each other.

Since the core pillars 330 in different regions have the same length and flush end surfaces, in the process of forming the core pillars 330, the pattern of the mask is simple, which simplifies the process step.

Figure 13:
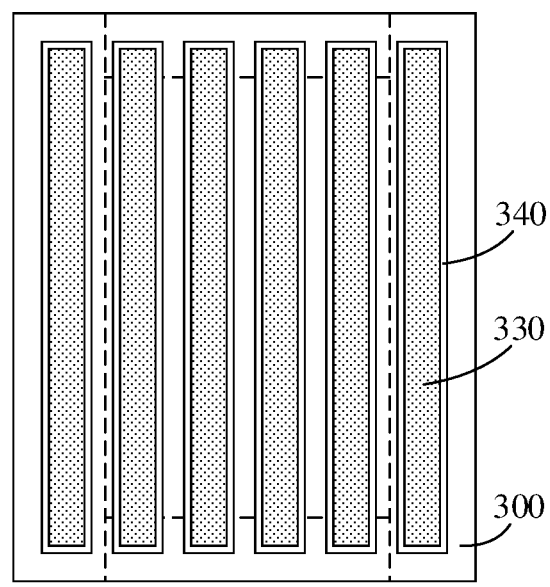
FIG. 13 is a view illustrating a structure obtained by implementing a step of forming initial mask layers on the base of the semiconductor structure according to the second embodiment of the present disclosure.

Referring to FIG. 13, an initial mask layer 340 surrounding and covering a sidewall of each of the core pillars 330 is formed on the base 300. In this embodiment, the core pillars 330 located in the dummy regions 220 (shown in FIG. 4) and the core pillars 330 located in the central region 210 (shown in FIG. 4) have the same length, so the initial mask layers 340 formed in different regions also have the same length in a second direction.

Figure 14:
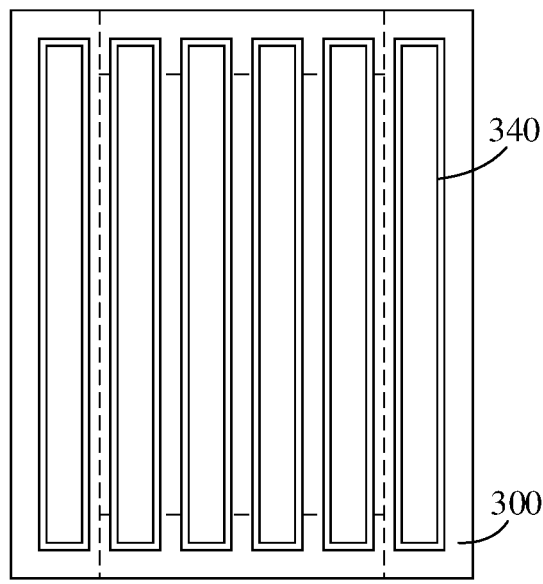
FIG. 14 is a view illustrating a structure obtained by implementing a step of removing the core pillars of the semiconductor structure according to the second embodiment of the present disclosure.

Referring to FIG. 14, the core pillars 330 are removed.

Figure 15:
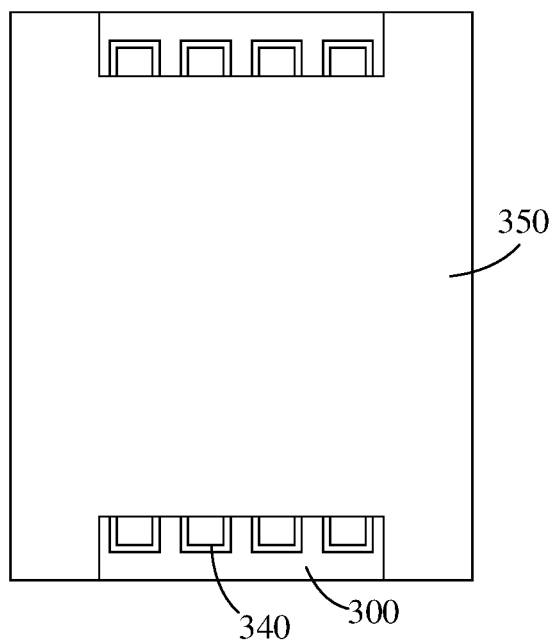
FIG. 15 is a view illustrating a structure obtained by implementing a step of forming a pattern layer of the semiconductor structure according to the second embodiment of the present disclosure.

Referring to FIG. 15, a pattern layer 350 is formed. The pattern layer 350 covers the initial mask layers 340 in the dummy regions 220 (shown in FIG. 4) and the molding region 212 (shown in FIG. 4), and exposes the initial mask layers 340 in the cutting regions 211 (shown in FIG. 4). The initial mask layers 340 in the cutting regions 211 (shown in FIG. 4) are etched away by using the pattern layer 350 as a mask.

The core pillars 330 located in the dummy regions 220 (shown in FIG. 4) and the core pillars 330 located in the central region 210 (shown in FIG. 4) have the same length, and have ends flush with each other. Therefore, when the pattern layer 350 is required to cover the core pillars 330 in the dummy regions 220 and the core pillars 330 in the molding region 212, the shape of an orthographic projection of the pattern layer 350 on the base 300 is an I-shape.

Figure 16:
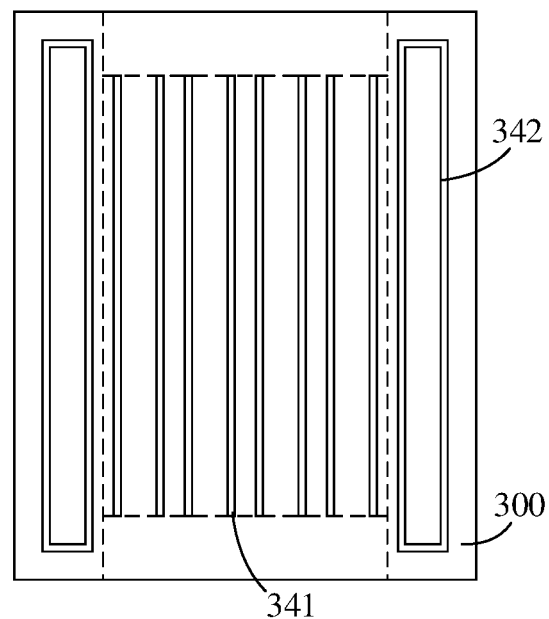
FIG. 16 is a view illustrating a structure obtained by implementing a step of forming mask sidewall strips and ring-shaped sidewalls of the semiconductor structure according to the second embodiment of the present disclosure.

Referring to FIG. 16, the initial mask layers 340 located in the cutting regions 211 (shown in FIG. 4) are removed to form multiple spaced mask sidewall strips 341 in the molding region 212 (shown in FIG. 4), and the initial mask layers 340 in the dummy regions 220 (shown in FIG. 4) are retained as ring-shaped sidewalls 342.

The ring-shaped sidewalls 342 in the second direction are longer than the mask sidewall strips 341.

Figure 17:
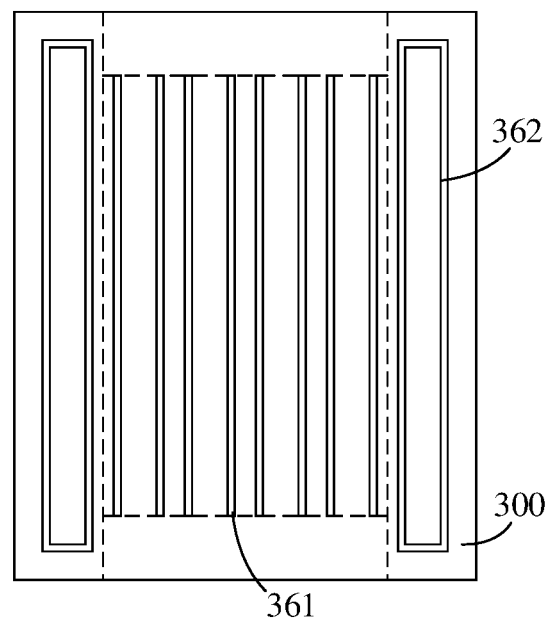
FIG. 17 is a view illustrating a structure obtained by implementing a step of forming functional structures and dummy functional structures of the semiconductor structure according to the second embodiment of the present disclosure.

Referring to FIGS. 16 and 17, the base 300 is etched by using the mask sidewall strips 341 as masks to form multiple functional structures 361, and the base 300 is etched by using the ring-shaped sidewalls 342 as masks to form dummy functional structures 362 on two sides of multiple functional structures 361.

The length of the dummy functional structures 362 in the second direction is greater than that of the functional structures 361. A greater length of the dummy functional structures 362 indicates greater regions occupied by the dummy functional structures 362. When the semiconductor structure is formed, the optical proximity effect-induced irregular patterns on the edges are more likely to fall into the regions where the dummy functional structures 362 are located.

Compared with the first embodiment, in the forming method of a semiconductor structure in this embodiment, the length of the dummy functional structures in the second direction is greater than that of the functional structures, thereby enlarging the regions occupied by the dummy functional structures. When the semiconductor structure is formed, the optical proximity effect-induced irregular patterns on the edges are more likely to fall into the regions where the dummy functional structures are located, such that the formed functional structures can achieve a desired effect.

A third embodiment of the present disclosure provides a semiconductor structure, which is formed by the above-mentioned forming method of a semiconductor structure.

Referring to FIG. 11, the semiconductor structure in this embodiment includes: a base 200, multiple spaced functional structures 261 and dummy functional structures 262. The base 200 includes a central region 210 (shown in FIG. 4) and dummy regions 220 (shown in FIG. 4) located on two opposite sides of the central region 210 (shown in FIG. 4). The functional structures 261 are located on the base 200 in the central region 210 (shown in FIG. 4). The dummy functional structures 262 are located on the base 200 in the dummy regions 220 (shown in FIG. 4), and the dummy functional structures 262 are ring-shaped structures.

In this embodiment, the dummy functional structures 262 are rectangular ring-shaped structures. In other embodiments, the dummy functional structures may also be other ring-shaped structures, such as circular ring-shaped structures or elliptical ring-shaped structures, without affecting the stability of the dummy functional structures.

The multiple functional structures 261 are arranged in parallel in a first direction, and the thickness of the functional structures 261 in the first direction is greater than or equal to that of the dummy functional structures 262. The functional structures are effective structures of the semiconductor structure, and the dummy functional structures are only protective measures, so the amount of the material used and the space occupied by the dummy functional structures are relatively less. It should be understood that, in other embodiments, the thickness of the dummy functional structures in the first direction may also be greater than that of the functional structures.

In this embodiment, the functional structures 261 extend in a second direction, and the length of the dummy functional structures 262 in the second direction is less than or equal to that of the functional structures 261.

In other embodiments, referring to FIG. 17, functional structures 361 extend in a second direction, and the length of dummy functional structures 362 in the second direction is greater than that of the functional structures 361. The length of the dummy functional structures 362 in the second direction is greater than that of the functional structures 361, and a greater length of the dummy functional structures 362 indicates greater regions occupied by the dummy functional structures 362. When the semiconductor structure is formed, the optical proximity effect-induced irregular patterns on the edges are more likely to fall into the regions where the dummy functional structures 362 are located.

In this embodiment, each of the dummy functional structures 262 includes a first side, a second side, a third side and a fourth side that are sequentially connected. The first side and the third side are opposite to each other, and the first side and the third side are parallel to the functional structures 261. In other embodiments, the second side and the fourth side of the dummy functional structure are parallel to the functional structures, and the first side and the third side are not parallel to the functional structures.

The functional structures 261 are bit line structures or word line structures, and the dummy functional structures 262 are dummy bit line structures or dummy word line structures.

In the semiconductor structure in this embodiment, the ring-shaped dummy functional structures are formed on two opposite sides of the functional structures, and the dummy functional structures are located on the edges of the functional structures. The optical proximity effect-induced irregular patterns on the edges are located on the dummy functional structures, so as to avoid affecting the functional structures. In addition, compared with discrete dummy functional structures, the ring-shaped dummy functional structures are more stable and less prone to deformation, thereby avoiding adversely affecting the semiconductor structure.

In the description of the specification, the description with reference to terms such as "an embodiment", "an illustrative embodiment", "some implementations", "an illustrative implementation" and "an example" means that the specific features, structures, materials or characteristics described in combination with the implementation(s) or example(s) is included in at least one implementation or example of the present disclosure.

In this specification, the schematic expression of the above terms does not necessarily refer to the same implementation or example. Moreover, the described specific features, structures, materials or characteristics may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It should be understood that the terms such as "first" and "second" used herein may be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

The embodiments of the present disclosure provide a forming method of a semiconductor structure and a semiconductor structure. The dummy functional structures are formed on two sides of the functional structures, and the dummy functional structures are ring-shaped structures. The optical proximity effect-induced irregular patterns on the edges of the formed semiconductor structure are located on the dummy functional structures, which will not adversely affect the functional structures. In addition, the ring-shaped dummy functional structures are stable and firm, and are not prone to deformation.

The invention claimed is:
1. A forming method of a semiconductor structure, wherein the forming method comprises:
providing a base, wherein the base comprises a central region and dummy regions located on two opposite outer sides of edges of the central region in a first direction, and the central region comprises a molding region and cutting regions located on two opposite outer sides of edges of the molding region in a second direction;
forming core pillars on the base, wherein the core pillars located in the central region straddle the molding region and the cutting regions, and at least one of the core pillars is formed in each of the dummy regions;
forming an initial mask layer surrounding and covering a sidewall of each of the core pillars on the base;
forming a pattern layer, wherein the pattern layer covers the initial mask layers in the dummy regions and the molding region, and exposes the initial mask layers in the cutting regions; and etching to remove the initial mask layers located in each of the cutting regions to form mask sidewall strips in the molding region, and retain at least one of the initial mask layers in each of the dummy regions as a ring-shaped sidewall;
removing the core pillars located in the central region and the dummy regions; and
etching the base by using the mask sidewall strips as masks to form multiple spaced functional structures, and etching the base by using the ring-shaped sidewalls as masks to form dummy functional structures on two sides of the multiple spaced functional structures;
wherein a length of the core pillars located in the dummy regions is less than a length of the core pillars located in the central region; a shape of an orthographic projection of the formed pattern layer on the base is a rectangle; or the core pillars located in the dummy regions and the core pillars located in the central region have the same length, and have end surfaces flush with each other; a shape of an orthographic projection of the formed pattern layer on the base is an I-shape.

2. The forming method of the semiconductor structure according to claim 1, wherein the core pillars are removed first, and then the initial mask layers located in the cutting regions are removed.

3. The forming method of the semiconductor structure according to claim 1, wherein the initial mask layers located in the cutting regions are removed first, and then the core pillars are removed.

4. The forming method of the semiconductor structure according to claim 2, wherein the core pillars are removed by using a wet etching process.

5. The forming method of the semiconductor structure according to claim 3, wherein the core pillars are removed by using a wet etching process.

6. The forming method of the semiconductor structure according to claim 1, wherein the base comprises a substrate and an initial bit line layer located on the substrate; the etching the base by using the mask sidewall strips as masks comprises: etching the initial bit line layer to form the multiple spaced functional structures, the multiple spaced functional structures being bit line structures; the etching the base by using the ring-shaped sidewalls as masks comprises: etching the initial bit line layer to form the dummy functional structures, the dummy functional structures being dummy bit line structures.

7. A semiconductor structure, wherein the semiconductor structure comprises:
a base, wherein the base comprises a central region and dummy regions located on two opposite sides of the central region;
multiple spaced functional structures, wherein the functional structures are located on the base in the central region; and
dummy functional structures located at two opposite sides of the multiple spaced functional structures, wherein the dummy functional structures are located on the base in the dummy regions, and the dummy functional structures are ring-shaped structures;
wherein a length of the multiple spaced functional structures located in the central region is less than a length of the dummy functional structures located in the dummy regions, a shape of an orthographic projection of a pattern consist of the multiple spaced functional structures and the dummy functional structures on the base is an I-shape.

8. The semiconductor structure according to claim 7, wherein the dummy functional structures are rectangular ring-shaped structures.

9. The semiconductor structure according to claim 7, wherein the multiple spaced functional structures are arranged in parallel in a first direction; a thickness of the functional structures in the first direction is greater than or equal to a thickness of the dummy functional structures.

10. The semiconductor structure according to claim 7, wherein the multiple spaced functional structures extend in a second direction; a length of the dummy functional structures in the second direction is greater than a length of the multiple spaced functional structures.

11. The semiconductor structure according to claim 7, wherein each of the dummy functional structures comprises a first side, a second side, a third side and a fourth side that are sequentially connected; the first side and the third side are opposite to each other, and the first side and the third side are parallel to the multiple spaced functional structures.

12. The semiconductor structure according to claim 7, wherein the multiple spaced functional structures are bit line structures or word line structures, and the dummy functional structures are dummy bit line structures or dummy word line structures.

13. A semiconductor structure, comprising:
a base, wherein the base comprises a central region and dummy regions located on two opposite sides of the central region;
multiple spaced functional structures, wherein the functional structures are located on the base in the central region; and
dummy functional structures located at two opposite sides of the multiple spaced functional structures, wherein the dummy functional structures are located on the base in the dummy regions, and the dummy functional structures are ring-shaped structures;
wherein a length of the multiple spaced functional structures located in the central region is same as a length of the dummy functional structures located in the dummy regions, a shape of an orthographic projection of a pattern consist of the multiple spaced functional structures and the dummy functional structures on the base is a rectangle.

14. The semiconductor structure according to claim 13, wherein the dummy functional structures are rectangular ring-shaped structures.

15. The semiconductor structure according to claim 13, wherein the multiple spaced functional structures are arranged in parallel in a first direction; a thickness of the functional structures in the first direction is greater than or equal to a thickness of the dummy functional structures.

16. The semiconductor structure according to claim 13, wherein each of the dummy functional structures comprises a first side, a second side, a third side and a fourth side that are sequentially connected; the first side and the third side are opposite to each other, and the first side and the third side are parallel to the multiple spaced functional structures.

17. The semiconductor structure according to claim 13, wherein the multiple spaced functional structures are bit line structures or word line structures, and the dummy functional structures are dummy bit line structures or dummy word line structures.

* * * * *